United States Patent
Ha et al.

(10) Patent No.: US 7,808,177 B2
(45) Date of Patent: Oct. 5, 2010

(54) DISPLAY DEVICE AND METHOD OF MANUFACTURING

(75) Inventors: Jae-kook Ha, Gyeonggi-do (KR);
Soon-wook Cha, Gyeonggi-do (KR);
Joo-hyeon Lee, Gyeonggi-do (KR);
Soo-yeon Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 564 days.

(21) Appl. No.: 11/653,684

(22) Filed: Jan. 12, 2007

(65) Prior Publication Data
US 2007/0176537 A1 Aug. 2, 2007

(30) Foreign Application Priority Data
Jan. 16, 2006 (KR) ............... 10-2006-0004545
Jan. 16, 2006 (KR) ............... 10-2006-0004546

(51) Int. Cl.
*H01L 51/52* (2006.01)
*H01L 51/56* (2006.01)
(52) U.S. Cl. ............... 313/506; 313/504; 313/509; 445/24
(58) Field of Classification Search .......... 313/500, 313/504, 505, 506, 509
See application file for complete search history.

(56) References Cited

U.S. PATENT DOCUMENTS 5,703,436 A * 12/1997 Forrest et al. ............ 313/506
5,837,391 A * 11/1998 Utsugi .................... 428/690
6,361,887 B1 * 3/2002 Shi et al. ................. 428/690
6,462,469 B1 * 10/2002 Young .................... 313/504
2002/0145381 A1 * 10/2002 Humbs ................... 313/504
2004/0031957 A1 * 2/2004 Tyan ..................... 257/40
2004/0183434 A1 9/2004 Yeh et al.
2004/0191566 A1 * 9/2004 Kikuchi et al. ........... 428/690
2004/0263072 A1 * 12/2004 Park et al. ............... 313/509
2005/0056840 A1 * 3/2005 Yamazaki et al. ........ 257/59
2005/0062408 A1 * 3/2005 Yoo et al. ............... 313/504

OTHER PUBLICATIONS

English Language Abstract, KR Patent First Publication No. 1020050073342, Jul. 13, 2005, 1 page.
English Language Abstract, KR Patent First Publication No. 1020050029824, Mar. 29, 2005, 1 page.
English Language Abstract, JP Patent First Publication No. 2004-356043, Dec. 16, 2004, 1 page.
English Language Abstract, KR Patent First Publication No. 1020030023298, Mar. 19, 2003, 1 page.
English Language Abstract, JP Patent First Publication No. 2000-252073, Sep. 14, 2000, 1 page.

* cited by examiner

*Primary Examiner*—Nimeshkumar D Patel
*Assistant Examiner*—Steven Horikoshi
(74) *Attorney, Agent, or Firm*—Innovation Counsel LLP

(57) ABSTRACT

A display device comprising: a thin film transistor formed on an insulating substrate; a first anode electrically connected to the thin film transistor; a first organic layer formed on the first anode and comprising a first light-emitting layer; a second anode formed on the first organic layer and electrically connected to the thin film transistor; a second organic layer formed on the second anode and comprising a second light-emitting layer; and a cathode formed on the second organic layer.

14 Claims, 26 Drawing Sheets

DISPLAY DEVICE AND METHOD OF MANUFACTURING

CROSS-REFERENCE TO RELATED APPLICATIONS

This application claims the benefit of Korean Patent Application No. 2006-0004545, filed on Jan. 16, 2006, and No. 2006-0004546, filed on Jan. 16, 2006, in the Korean Intellectual Property Office, the disclosures of which are incorporated herein by reference.

1. Field of the Invention

The present invention relates to a display device and a method of manufacturing the same, and more particularly, to a display device which employs a plurality of light emitting layers to improve light emitting efficiency.

2. Description of the Related Art

The organic light emitting diode OLED device exhibits low-power requirements, light weight, slim shape, wide viewing angle, and high-speed response. An OLED can be either a passive or an active matrix type. The passive matrix type can be fabricated through a simplified manufacturing process, but power consumption rapidly increases as the display area and resolution increase. Thus, the passive matrix type is applied mainly to a small-sized display device. In contrast, the active matrix type can be applied to a large area screen and high-resolution device although a complicated fabrication process is involved.

In the active matrix OLED, a thin film transistor is connected to each pixel region and the light emission of the light-emitting layer is controlled for each individual pixel region. A pixel electrode, disposed in each pixel region, is electrically separated from its neighboring pixel electrodes so as to be driven independently. An organic layer such as a light-emitting layer or the like is sequentially formed on the pixel electrode. A common electrode is formed on the light-emitting layer.

The organic layer for an OLED can be formed by a wet method or a dry method. The wet method includes ink jetting, spin coating, spray coating, roll to roll, nozzle coating, etc. The dry method is a way to form a low molecular organic layer, and usually employs an evaporation method.

The wet method uses less materials and is suitable for fabricating a large area screen OLED. However, when an OLED is fabricated by the wet method, the number of an organic layer is limited, and thus the OLED has difficulty in improving efficiency and brightness.

SUMMARY OF THE INVENTION

In accordance with an aspect of the present invention a thin film transistor is formed on an insulating substrate; a first anode is electrically connected to the thin film transistor; a first organic layer is formed on the first anode comprising having a first light-emitting layer; a second anode is formed on the first organic layer and electrically connected to the thin film transistor; a second organic layer is formed on the second anode comprising having a second light-emitting layer; and a cathode is formed on the second organic layer.

According to another embodiment of the invention, the second anode directly contacts the first organic layer and the first anode and the second anode receive the same electric signal.

According to another embodiment of the invention, the second organic layer is formed in an overlapping area of the second anode and the cathode, and the second anode does not directly contact the cathode.

According to another embodiment of the invention, the first organic layer and the second organic layer comprise a polymer.

According to another embodiment of the invention, the display device further comprises a wall to surround the first organic layer and the second organic layer, wherein the first organic layer and the second organic layer are formed by an ink-jet process.

According to another embodiment of the invention, the first organic layer further comprises a first buffer layer disposed between the first light-emitting layer and the first anode, and the second organic layer further comprises a second buffer layer disposed between the second anode and the second light-emitting layer.

According to another embodiment of the invention, the first buffer layer and the second buffer layer include poly-3,4-ethylenedioxythiophene PEDOT and poly styrenesulfonate PSS.

According to another embodiment of the invention, the second anode comprises a first part disposed on the first organic layer; and a second part formed on the wall and connecting the thin film transistor and the first part.

According to another embodiment of the invention, the cathode comprises a first part disposed on the second organic layer; and a second part formed on the wall and connecting the neighboring first parts each other.

According to another embodiment of the invention, the cathode comprises one of a Ba/Al double layer, a Ba/Ag double layer, a Ca/Ag double layer, a LiF/Ca/Ag triple layer and a LiF/Ca/Al triple layer.

According to another embodiment of the invention, the first organic layer comprises polymer, and the second organic layer comprises a low molecular material.

BRIEF DESCRIPTION OF THE DRAWING

The above and/or other aspects and advantages of the present invention will be more readily appreciated from the following description of the embodiments, taken in conjunction with the accompanying drawings, in which.

DETAILED DESCRIPTION

Figure 1:
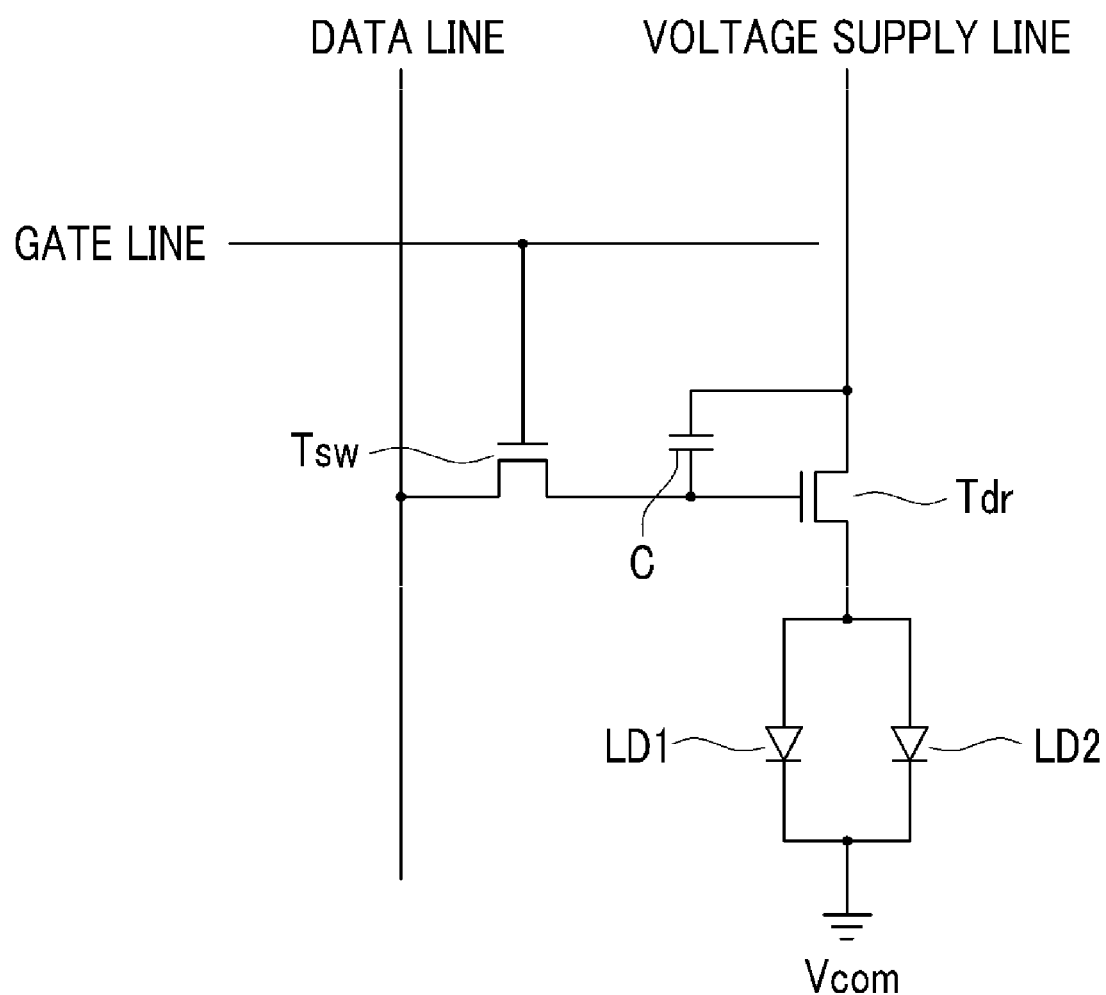
FIG. 1 is an equivalent circuit diagram of a display device according to a first exemplary embodiment of the present invention.

Referring to FIG. 1, a pixel comprises a plurality of signal lines including a gate line transmitting a scanning signal, a data line transmitting a data signal and a voltage supply line. The data line and the voltage supply line are disposed adjacently and parallel to each other. The gate line extends perpendicularly to the data line and the voltage supply line.

Each pixel comprises a pair of organic light emitting elements LD1 and LD2, a switching thin film transistor Tsw, a driving thin film transistor Tdr and a capacitor C.

The driving thin film transistor Tdr comprises a control terminal, an input terminal and an output terminal. The control terminal is connected to the switching thin film transistor Tsw, the input terminal is connected to the voltage supply line, and the output terminal is connected to the organic light emitting elements LD1 and LD2.

Organic light emitting elements LD1 and LD2 share an anode connected to the output terminal of the driving thin film transistor Tdr and a cathode connected to a common voltage Vcom. The organic light emitting elements LD1 and LD2 emit light with variable intensity depending on the output current from the driving thin film transistor Tdr. The intensity of the current from the driving thin film transistor Tdr varies depending on the voltage between the control terminal and the output terminal.

Switching thin film transistor Tsw comprises a control terminal, an input terminal and an output terminal. The control terminal is connected to the gate line, the input terminal is connected to the data line, and the output terminal is connected to the control terminal of the driving thin film transistor Tdr. The switching thin film transistor Tsw transmits the data signal applied to the data line to the driving thin film transistor Tdr according to the scanning signal applied to the gate line.

Capacitor C is connected between the control terminal of the driving thin film transistor Tdr and the input terminal thereof. Capacitor C is charged by and maintains the data signal input to the control terminal of driving thin film transistor Tdr.

Figure 2:
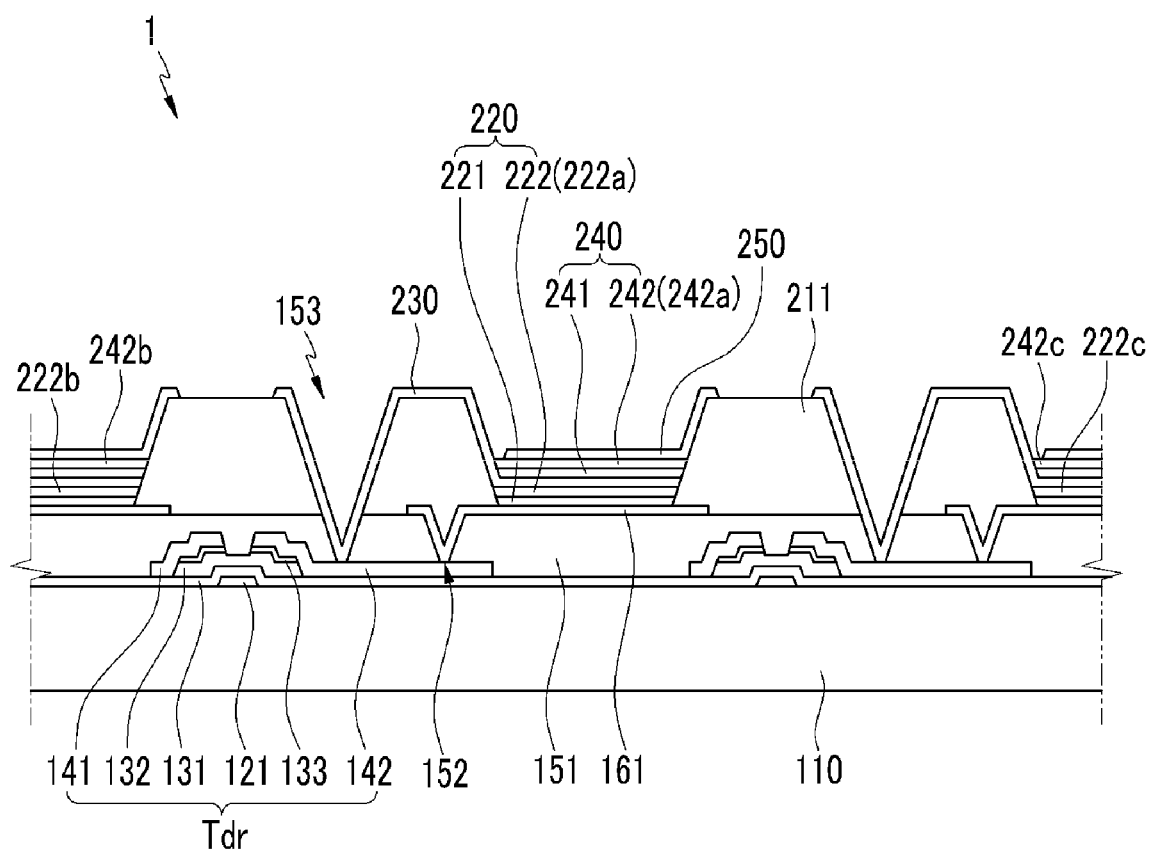
FIG. 2 is a sectional view of the display device according to the first exemplary embodiment of the present invention.

Referring to FIG. 2, a display device 1 according to a first exemplary embodiment of the present invention will be described in detail. FIG. 2 shows only the driving thin film transistor Tdr.

A gate line 121 is formed on an insulating substrate 110. Insulating substrate 110 is made of an insulating material such as glass, quartz, ceramic, plastic or the like. Gate insulating layer 131 is made of silicon nitride SiNx and formed on insulating substrate 110 and gate electrode 121. A semiconductor layer 132 and an ohmic contact layer 133 are sequentially formed on gate insulating layer 131 where the gate electrode is disposed. Semiconductor layer 132 is made of amorphous silicon, and ohmic contact layer 133 is made of n+ hydrogenated amorphous silicon which is highly doped with n-type impurities. Ohmic contact layer 123 is divided into two parts, with gate electrode 121 being disposed therebetween.

Source electrode 141 and drain electrode 142 are formed on ohmic contact layer 133 and gate insulating layer 131. Source electrode 141 and drain electrode 142 are separated from each other.

A passivation layer 151 is formed on source electrode 141, drain electrode 142 and semiconductor layer 132 exposed between the source and drain electrodes. Passivation layer 151 may comprise an inorganic layer including silicon nitride SiNx, an organic layer or a double layer of an inorganic layer and an organic layer. The organic layer may be made of one of benzocyclobutene BCB, olefin resin, acrylic resin, polyimde and fluoropolymer.

A portion of passivation layer 151 is removed from drain electrode 142 to form a contact hole 152.

A first anode 161 is formed on passivation layer 151. First anode 161 provides holes to a first light-emitting layer 222 and is made of a transparent conductive material such as indium tin oxide ITO or indium zinc oxide IZO and connected to drain electrode 142 through contact hole 152.

A wall 211 is formed on first anode 161 and passivation layer 151 to surround first anode 161. Wall 211 may be made of a photoresist material with thermal resistance and solvent resistance such as acrylic resin, polyimide resin, etc., an inorganic material such as SiO2 and TiO2, or a double layer of an organic layer and an inorganic layer. A contact hole 153 is formed in wall 211 and passivation layer 151 to expose drain electrode 142. A second anode 230 is connected to drain electrode 142 through contact hole 153.

A first organic layer 220 is formed on first anode 161. First organic layer 220 is made of polymer and comprises a first buffer layer 221 and first light-emitting layer 222. First light-emitting layer 222 comprises three sub-layers 222a, 222b and 222c each emitting a different color of light.

The first buffer layer 221 may comprise a hole-injecting material such as poly-3,4-ethylenedioxythiophene PEDOT, poly styrenesulfonate PSS or the like and be formed by ink-jetting the hole injecting material in an aqueous suspension state.

First light-emitting layer 222 may comprise polyfluorene derivatives, poly p-phenylene vinylene derivatives, polyphenylene derivatives, poly N-vinylcarbazole derivatives and poly thiophene derivatives; or compounds thereof doped with a perillene group pigment, rhodamine, rubrene, perillene, 9,10-diphenylanthracene, tetraphenylbutadiene, tetraphenylbutadiene, Nile red, cumarine 6, quinacridone and etc. The first light emitting layer 222 may be formed by an ink-jet process.

Second anode 230 is formed on first organic layer 220. The first anode 161 and the second anode 230 are connected to the same thin film transistor Tdr, thereby receiving the same data signal. The second anode 230 extends to wall 211 to be connected to the thin film transistor Tdr. Second anode 230 is formed using a shadow mask, which will be described later.

A second organic layer 240 is formed on second anode 230. The second organic layer 240 is made of polymer and comprises a second buffer layer 241 and a second light-emitting layer 242. Second light-emitting layer 242 comprises three sub-layers 242a, 242b and 242c each emitting different color of light.

Second buffer layer 241 may comprise a hole-injecting material such as poly-3,4-ethylenedioxythiophene PEDOT, poly styrenesulfonate PSS or the like and be formed by ink-jetting the hole injecting material in an aqueous suspension state.

Second light-emitting layer 242 may comprise polyfluorene derivatives, poly p-phenylene vinylene derivatives, polyphenylene derivatives, poly N-vinylcarbazole derivatives and poly thiophene derivatives; or compounds thereof doped with a perillene group pigment, rhodamine, rubrene, perillene, 9,10-diphenylanthracene, tetraphenylbutadiene, tetraphenylbutadiene, Nile red, cumarine 6, quinacridone and etc. The first light emitting layer 222 may be formed by an ink-jet process.

A cathode 250 is formed on second organic layer 240. Cathode 250 operates as a common electrode and applies the same common voltage to all the pixels. Cathode 250 may include one of a Ba/Al double layer, Ba/Ag double layer, a Ca/Ag double layer, a LiF/Ca/Ag triple layer and a LiF/Ca/Al triple layer. As the second organic layer 240 is disposed between cathode 250 and second anode 230, cathode 250 does not directly contact second anode 230. Cathode 250 is formed using a shadow mask, which will be described later.

Figure 3:
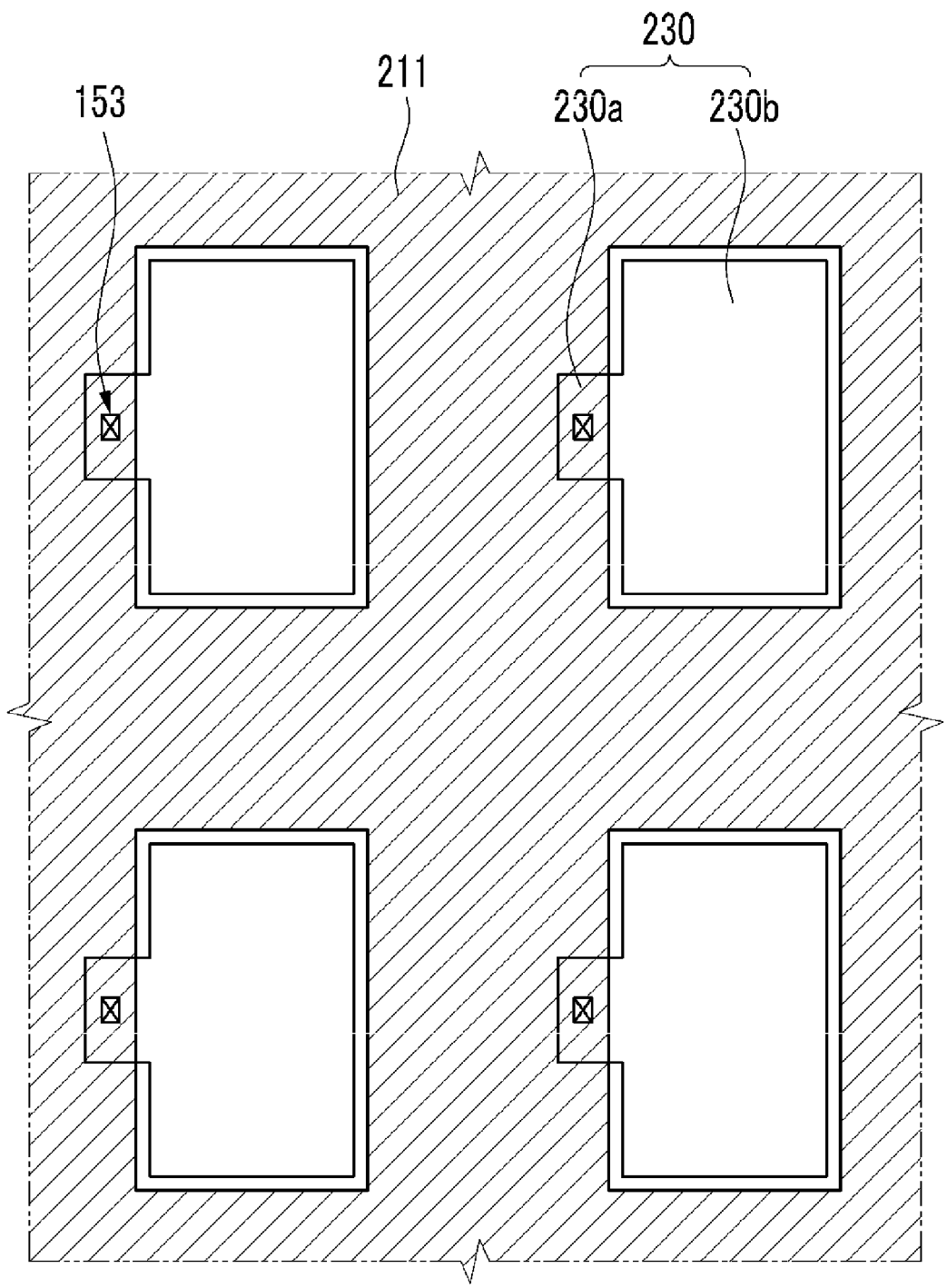
FIG. 3 is an arrangement view of a second anode in the display device according to the first exemplary embodiment of the present invention.

FIG. 3 is an arrangement view of the second anode in the display device according to the first exemplary embodiment of the present invention.

A plurality of second anodes 230 separated from each other are disposed in a matrix array at regular intervals. Each anode 230 includes a first part 230a having a relatively large area and a second part 230b having a relatively small area. The first part 230a is surrounded by the wall 211, most of which is disposed on the first organic layer 220. The second part 230b extends on the wall 211 and is connected to the thin film transistor Tdr through the contact hole 153.

Figure 4:
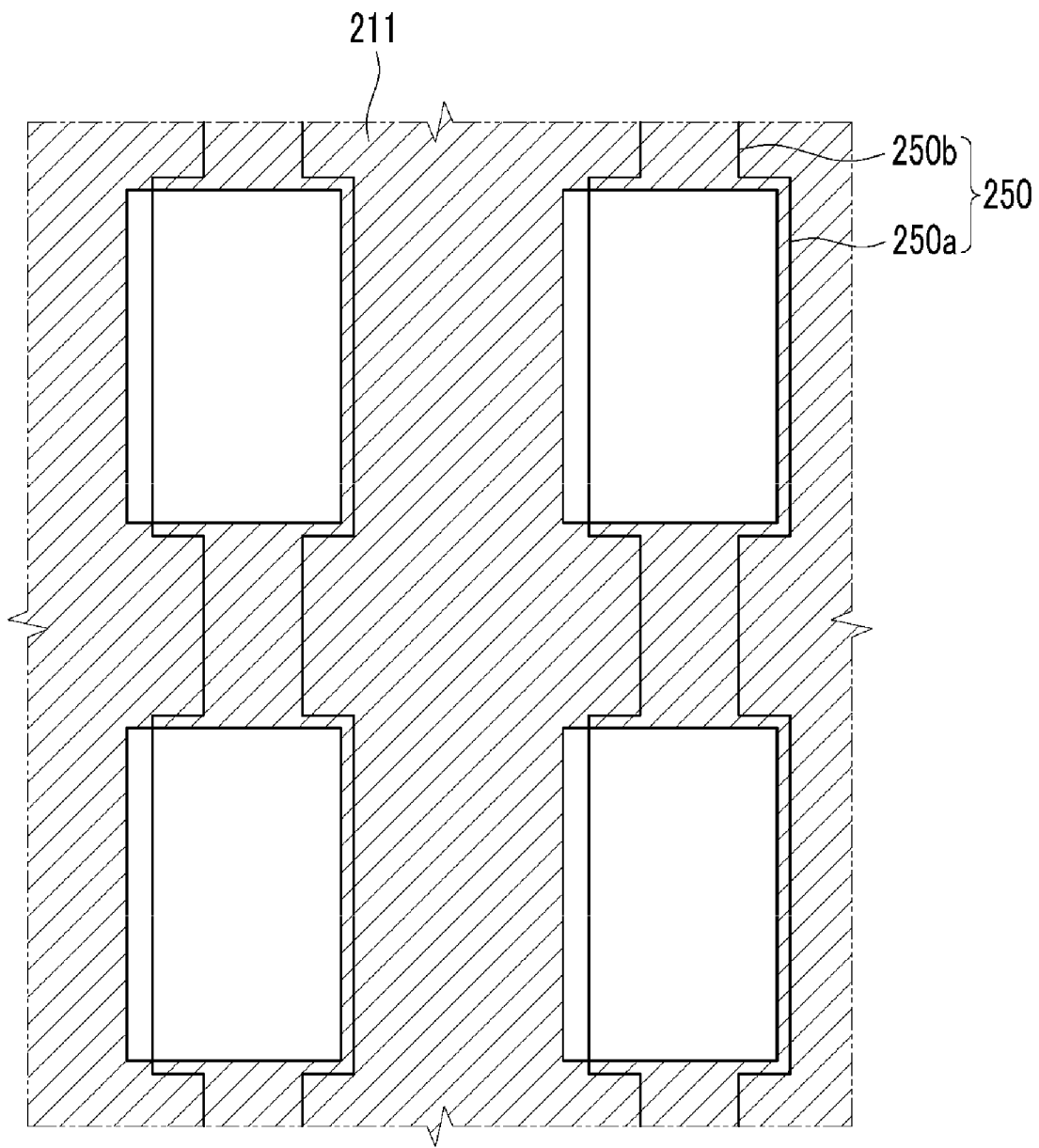
FIG. 4 is an arrangement view of a cathode in the display device according to the first exemplary embodiment of the present invention.

FIG. 4 is an arrangement view of the cathode in the display device according to the first exemplary embodiment of the present invention.

Cathode 250 is formed lengthwise at regular intervals. Cathode 250 includes a first part 250a having a relatively large width; and a second part 250b having a relatively small width and connecting the neighboring first parts 250a.

The first part 250a is mostly disposed on the second organic layer 240 between the walls 211, but partially extends on wall 211. The left side of the first part 250a does not extend on wall 211. The second part 250b is formed on the wall 211.

Figure 5:
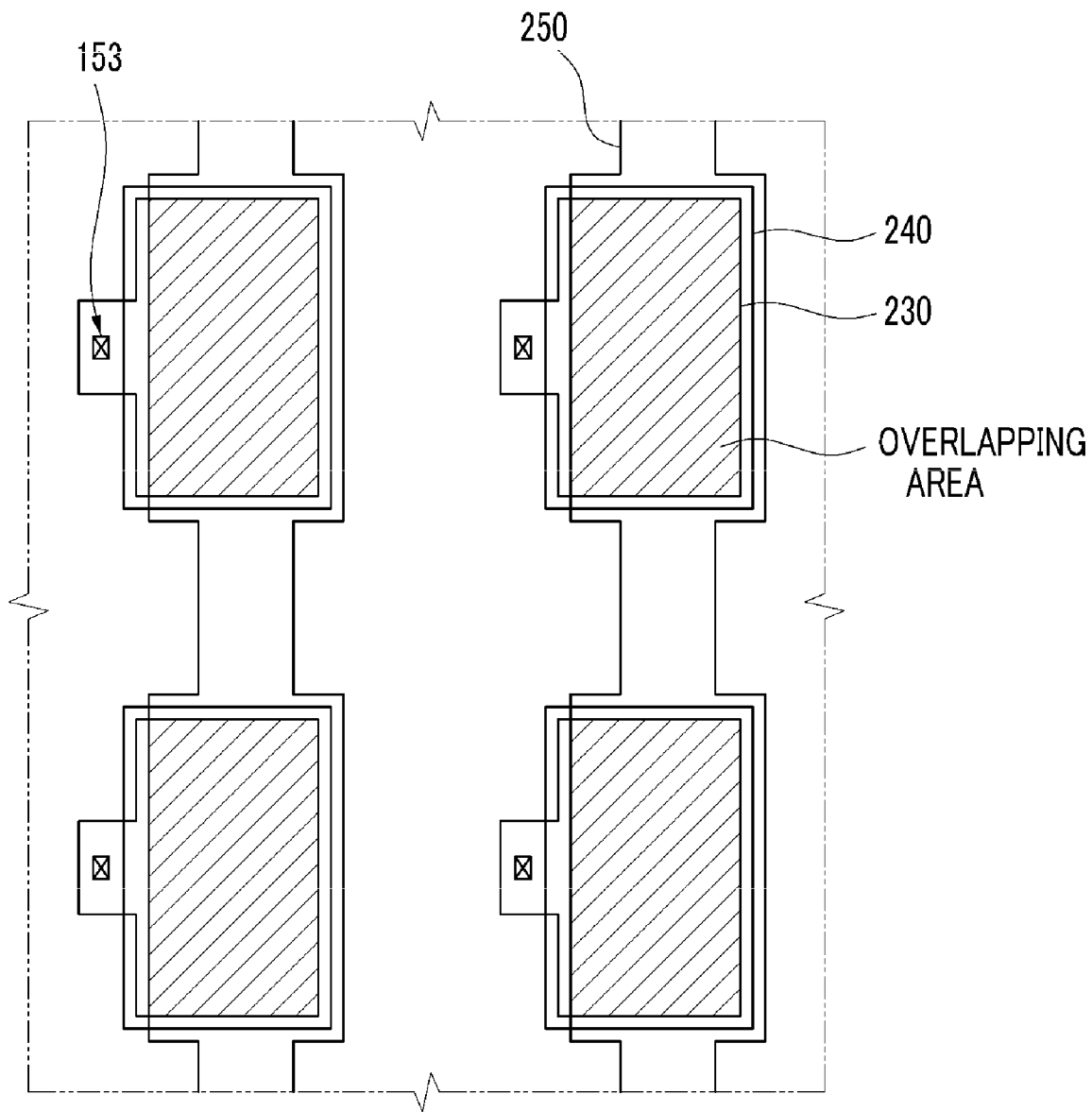
FIG. 5 is an arrangement view to illustrate the relation between the second anode and the cathode in the display device according to the first exemplary embodiment of the present invention.

FIG. 5 is an arrangement view to illustrate the relation between the second anode and the cathode in the display device according to the first exemplary embodiment of the present invention.

FIG. 5 shows an overlapping area marked with oblique lines where the second anode 230 overlaps cathode 250. The second anode 230 partially overlaps cathode 250 and extends to the left side of the overlapping area, and the cathode 250 extends to the upper, lower and right side of the overlapping area.

The overlapping area is disposed in the area of the second organic layer 240. In other words, the second organic layer 240 is disposed between the second anode 230 and the cathode 250 to insulate the second anode 230 from the cathode 250.

Figure 6:
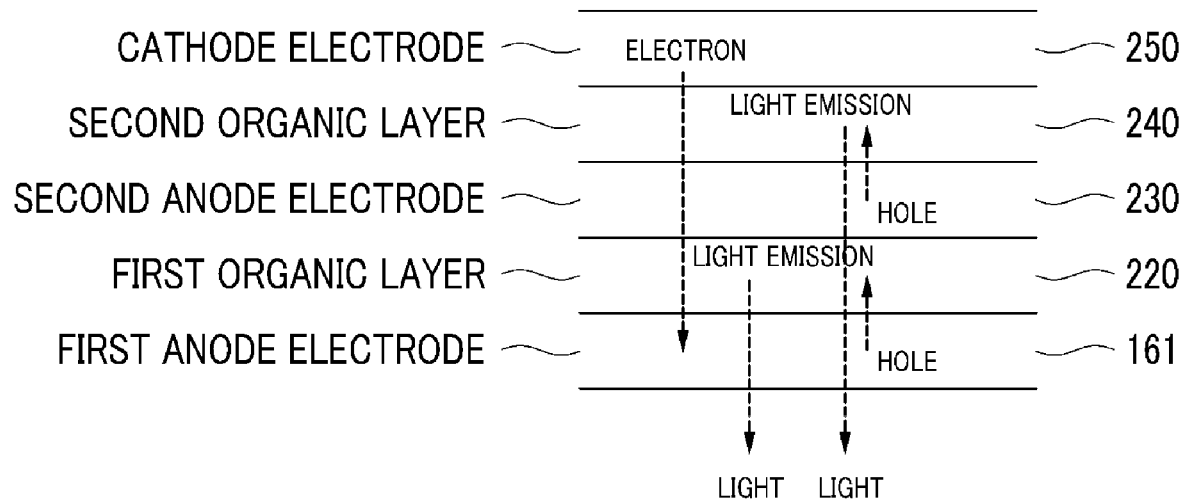
FIG. 6 illustrates a light emitting principle in the display device according to the first exemplary embodiment of the present invention.

FIG. 6 illustrates an aspect of the light-emitting principles of the display device according to the first exemplary embodiment of the present invention.

First anode 161 and second anode 230 which are connected to the same thin film transistor Tdr receive the same electric signal, i.e. data signal. Thus, first anode 161 and second anode 230 provide the same energy level of hole to first organic layer 220 and second organic layer 240, respectively. Cathode 250 provides electrons to first organic layer 220 and second organic layer 240.

Holes provided from first anode 161 and electrons provided from cathode 250 combine with each other in the first light-emitting layer 222 of first organic layer 220 to become excitons. The excitons generate light while inactivated. In the same manner, holes provided from second anode 230 and electrons provided from cathode 250 combine with each other in the second light-emitting layer 242 of the second organic layer 240 to become excitons. The excitons generate light while inactivated.

The display device according to the first exemplary embodiment comprises a pair of light-emitting layers 222 and 242, and thus the display device has improved efficiency and brightness as compared with a conventional display device. Further, as the light-emitting layers 222 and 242 share the cathode 250, an insulating layer does not need to be disposed between the light-emitting layers 222 and 242. Accordingly, an insulating layer forming process can be omitted, and brightness is not reduced due to the insulating layer.

FIGS. 7 through 15 illustrate a manufacturing method of the display device according to the first exemplary embodiment of the present invention.

Figure 7:
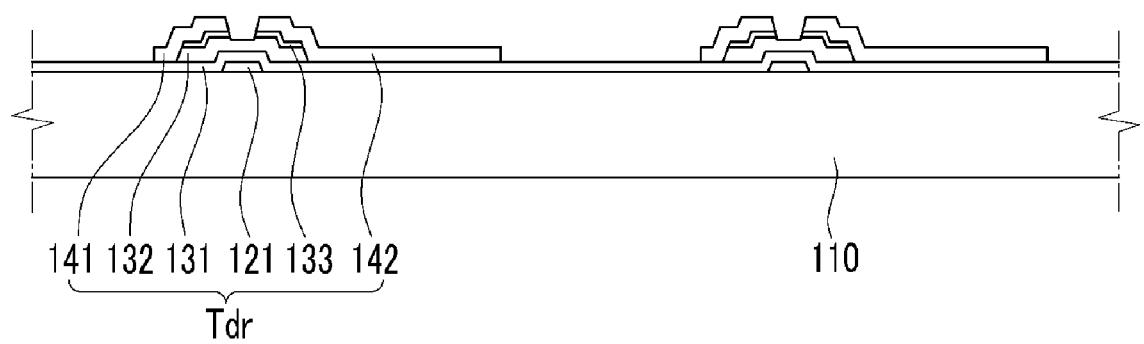
FIGS. 7 through 15 illustrate a manufacturing method of the display device according to the first exemplary embodiment of the present invention.

Referring to FIG. 7, the thin film transistor Tdr is formed on insulating substrate 110. A channel area of the thin film transistor Tdr is made of amorphous silicon and manufactured by a known method.

Figure 8:
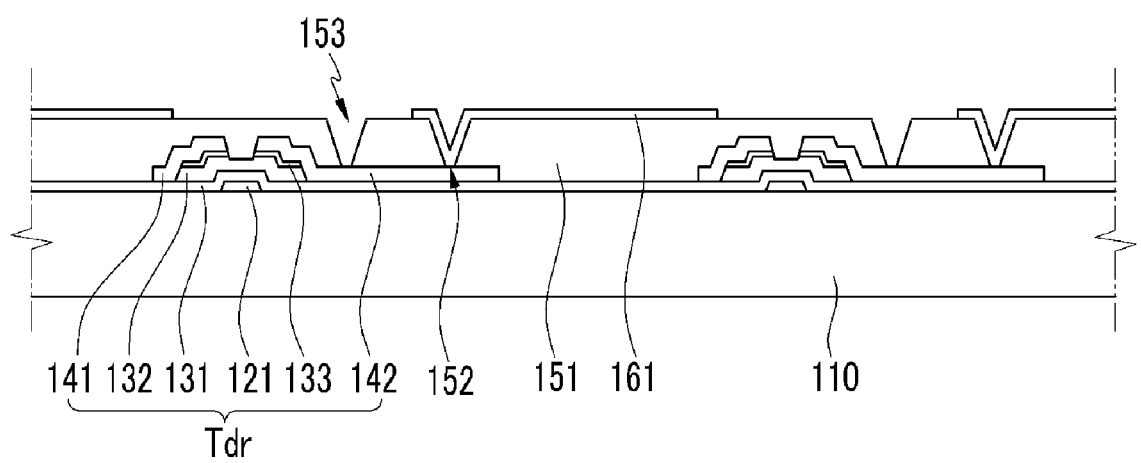

Referring to FIG. 8, the passivation layer 151 and the first anode 161 are formed on the thin film transistor Tdr. Passivation layer 151 made of silicon nitride may be formed by chemical vapor deposition or may be formed by slit coating or spin coating when made of an organic material. The contact holes 152 and 153 are formed by photolithgraphy. The first anode 161 is formed with a transparent conductive layer made of ITO, IZO or the like by sputtering and photolithography.

Figure 9:
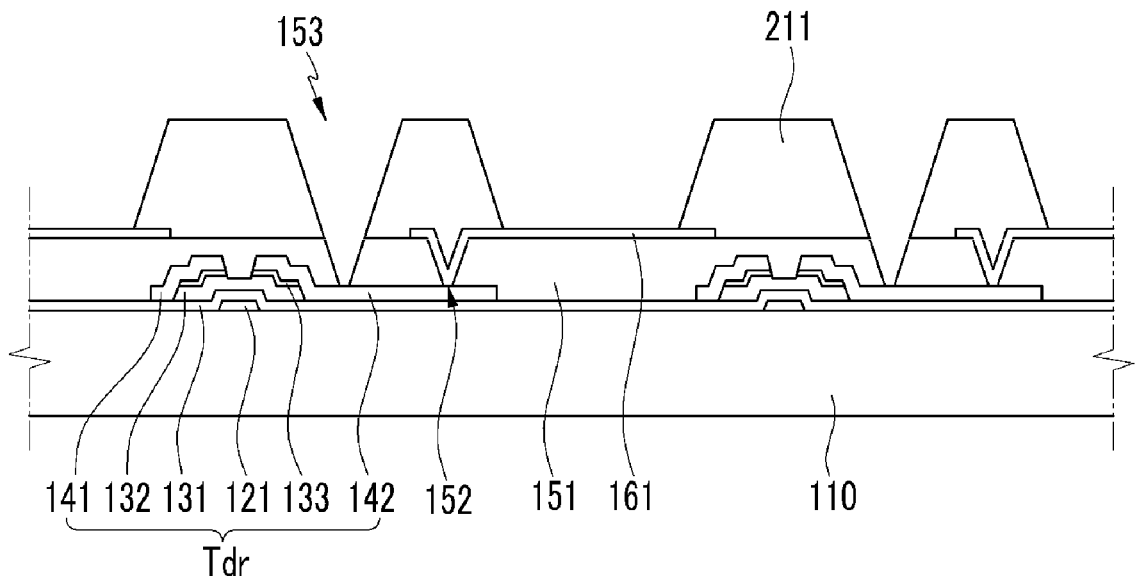

Referring to FIG. 9, the wall 211 is formed on the thin film transistor Tdr to surround the first anode 161. Wall 211 is formed by applying a photoresist layer, exposing and developing the photoresist layer. Here, the contact hole 153 is formed to expose the thin film transistor Tdr.

Figure 10:
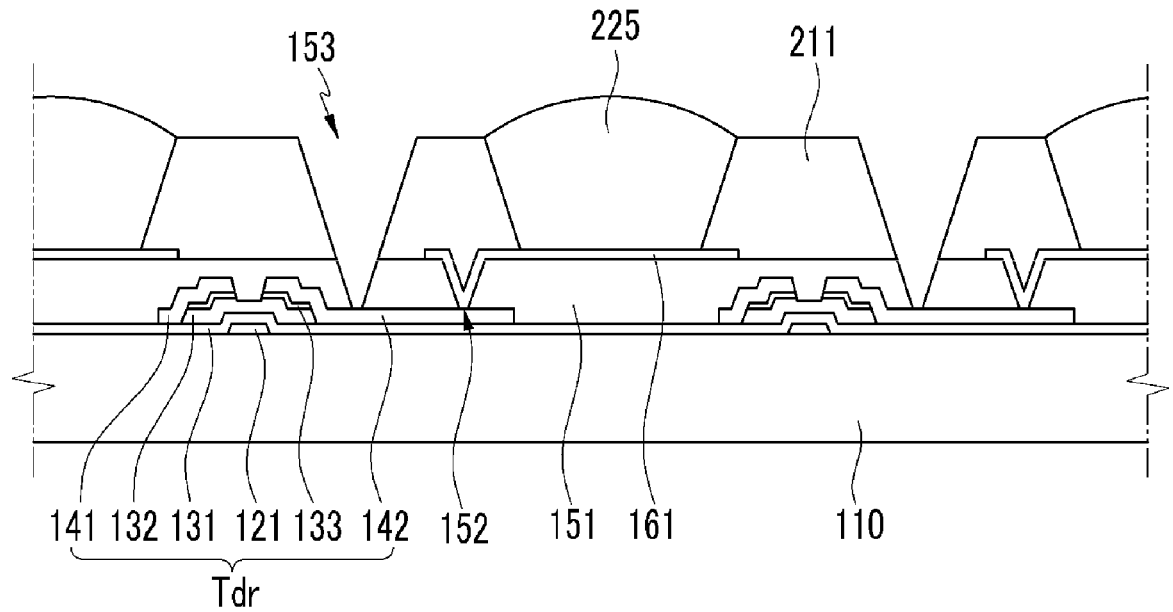

Referring to FIG. 10, the first buffer layer 221 is formed by dropping a first buffer solution 225, a polymer solution made of a hole-injecting material, on the first anode 161 between the walls 211 by ink-jetting and drying the first buffer solution 225. The first buffer solution 225 may be made of poly thiophene derivatives, such as poly-3,4-ethylenedioxythiophene PEDOT, poly styrenesulfonate PSS, and a polar solvent. The polar solvent may include, for example, isopropyl alcohol IPA, n-butanol, γ-buthylolactone, N-methylpyrrolidone NMP, 1,3-dimethyl-2-imidazolidinon DMI and derivatives thereof and glycolether such as cabitol acetate, buthyl cabitol acetate or the like.

The drying process is performed under a nitrogen atmosphere at room temperature and about 1 Torr. If the pressure is too low, the first buffer solution 225 may rapidly boil. Meanwhile, if temperature is more than the room temperature, evaporation speed of the solvent increases, and thus it is hard to form a layer uniformly.

Figure 11:
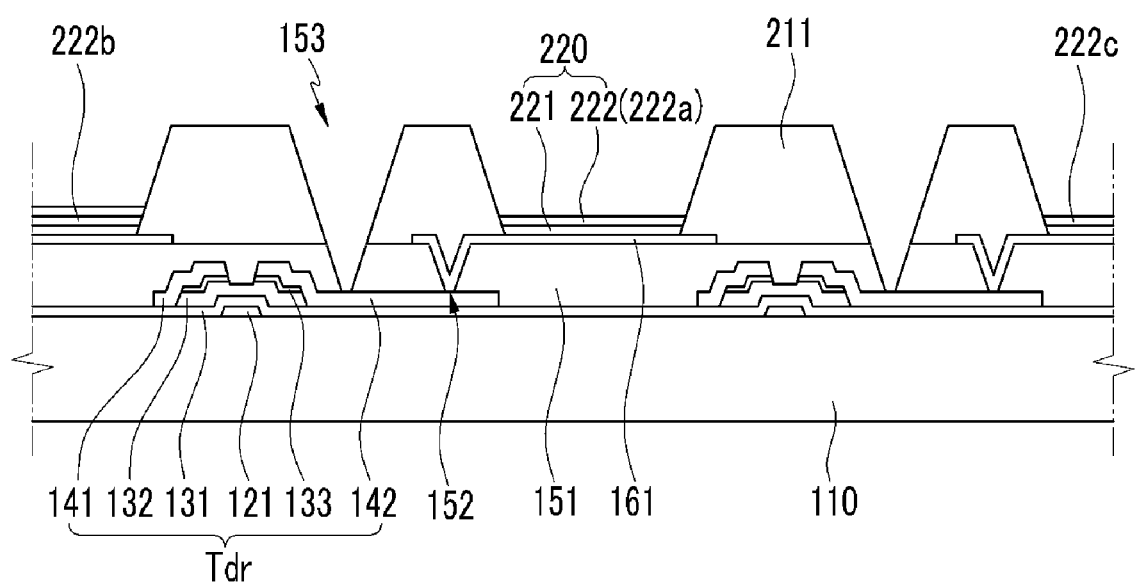

Referring to FIG. 11, the first light-emitting layer 222 is formed by dropping a first light-emitting solution, a polymer solution made of a light-emitting material, on the first buffer layer 221 by ink-jetting and drying the first light-emitting solution. Finally, the first organic layer 220 comprising the first buffer layer 221 and the first light-emitting layer 222 is completely formed.

Figure 12A:
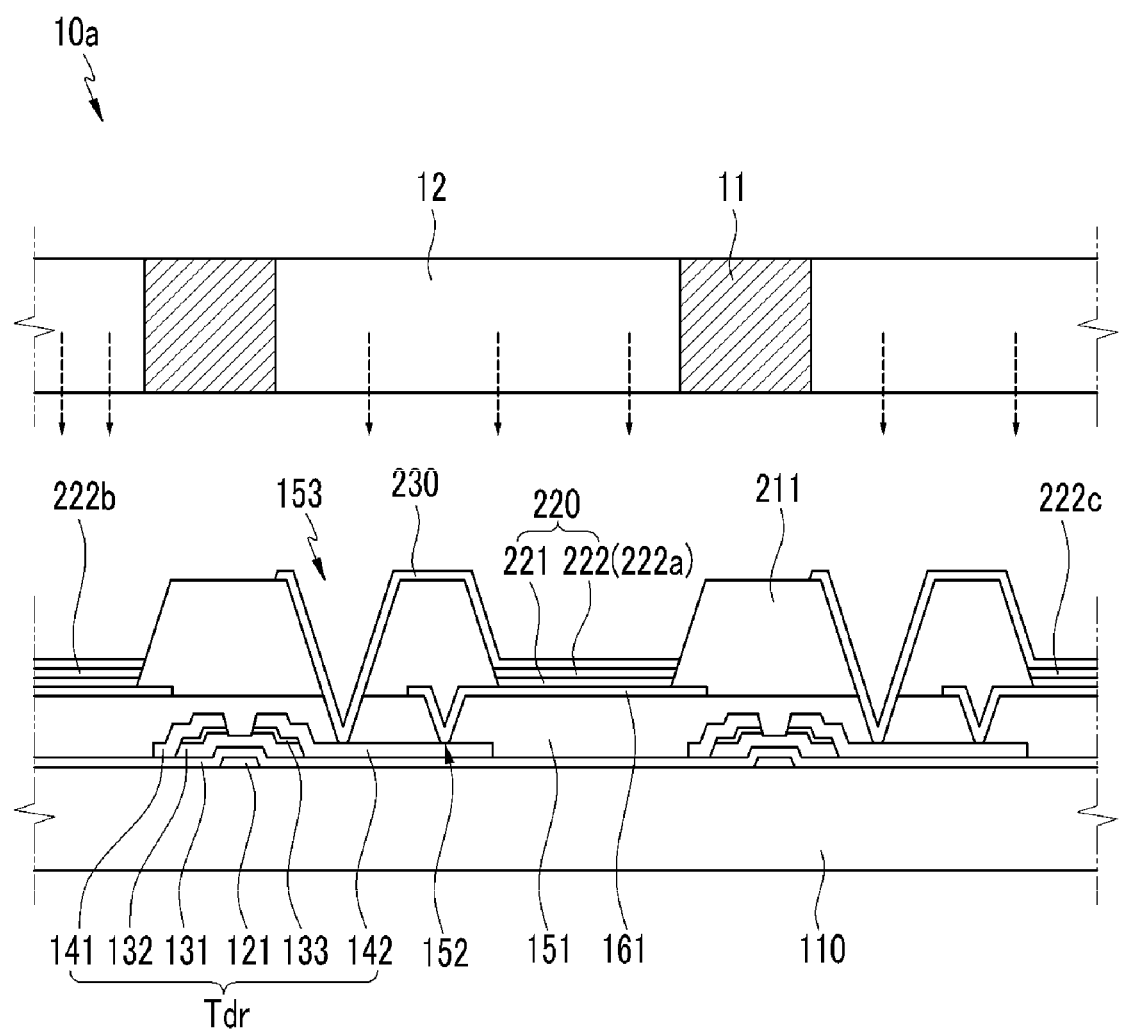
Figure 12B:
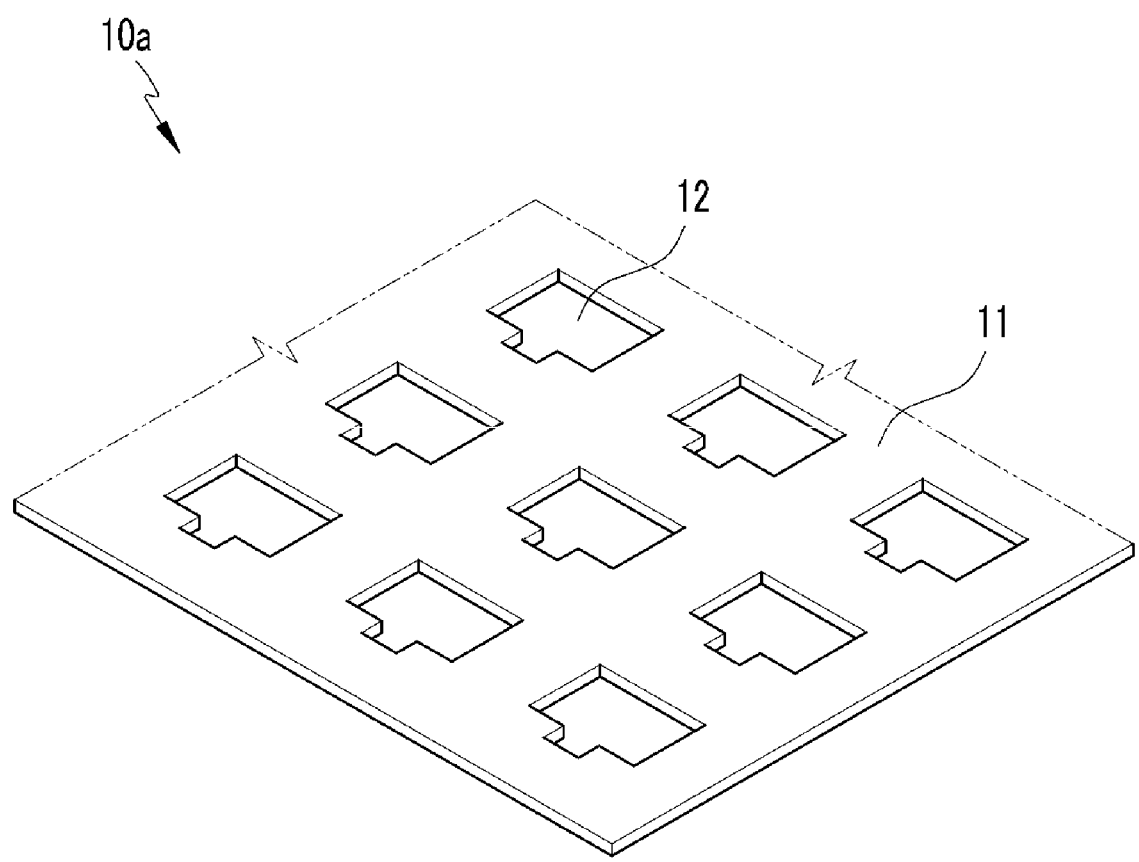

Referring to FIG. 12A, the second anode 230 is formed on the first organic layer 220 and the contact hole 153 using a shadow mask 10a shown in FIG. 12B.

The shadow mask 10a has a plurality of openings 12 formed in a matrix type. The openings 12 correspond to the second anode 230.

The second anode 230 is formed by sputtering or the like. The second anode 230 is deposited corresponding to the openings 12 of the shadow mask 10a but not deposited corresponding to blocking parts 11. According to the aforementioned process, the second anode 230 is formed on the first organic layer 220 and connected to the thin film transistor Tdr.

Figure 13:
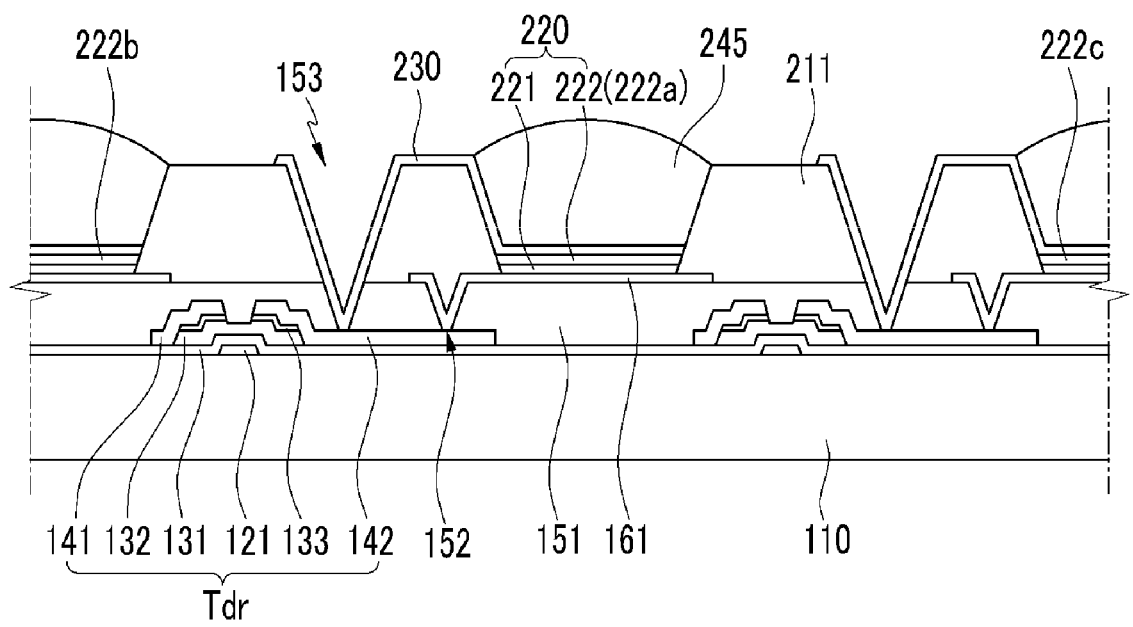

Referring to FIG. 13, the second buffer layer 241 is formed by dropping a second buffer solution 245, a polymer solution made of a hole-injecting material, on the second anode 230 by ink-jetting and drying the second buffer solution 245. The second buffer solution 245 may be made of poly thiophene derivatives, such as poly-3,4-ethylenedioxythiophene PEDOT, poly styrenesulfonate PSS, and a polar solvent. The polar solvent may include, for example, isopropyl alcohol IPA, n-butanol, γ-buthylolactone, N-methylpyrrolidone NMP, 1,3-dimethyl-2-imidazolidinon DMI and derivatives thereof and glycolether such as cabitol acetate, buthyl cabitol acetate or the like.

The drying process is performed under a nitrogen atmosphere at room temperature and about 1 Torr. If the pressure is too low, the second buffer solution 245 may rapidly boil. Meanwhile, if temperature is more than the room temperature, evaporation speed of the solvent increases, and thus it is hard to form a layer uniformly.

Figure 14:
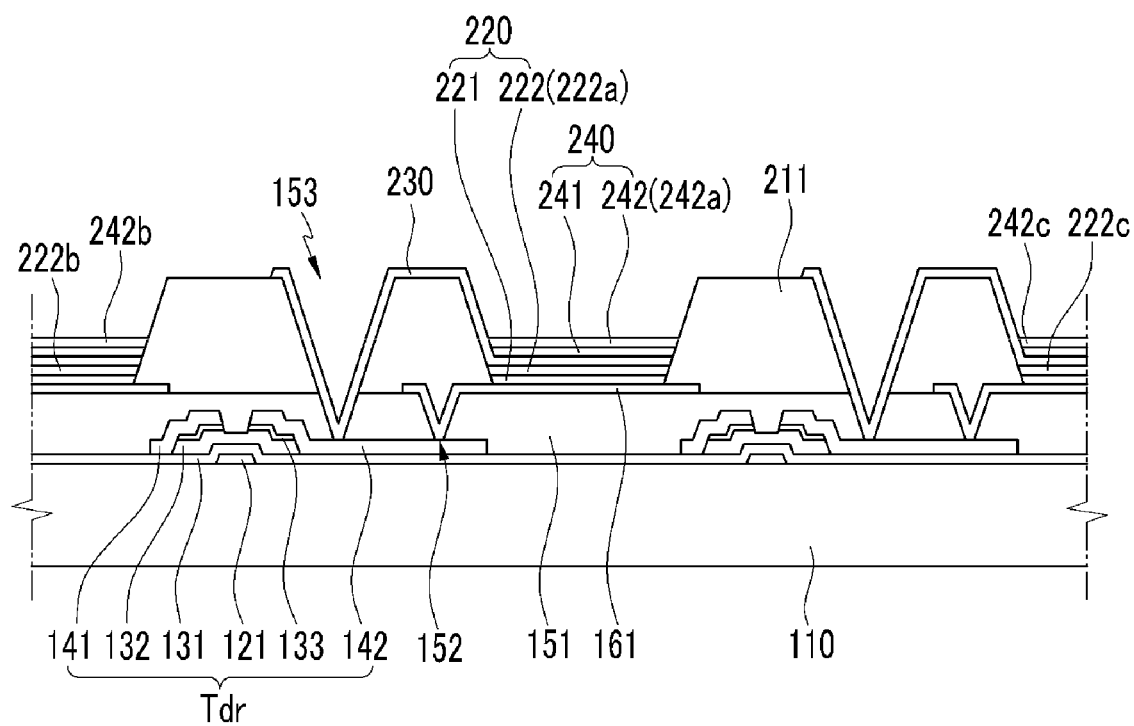

Referring to FIG. 14, the second light-emitting layer 242 is formed by dropping a second light-emitting solution, a polymer solution made of a light-emitting material, on the second buffer layer 241 by ink-jetting and drying the second light-emitting solution. Finally, the second organic layer 240 comprising the second buffer layer 241 and the second light-emitting layer 242 is completely formed. The first organic layer 220 and the second organic layer 240 are substantially formed in the same region and surrounded by the wall 211.

Figure 15A:
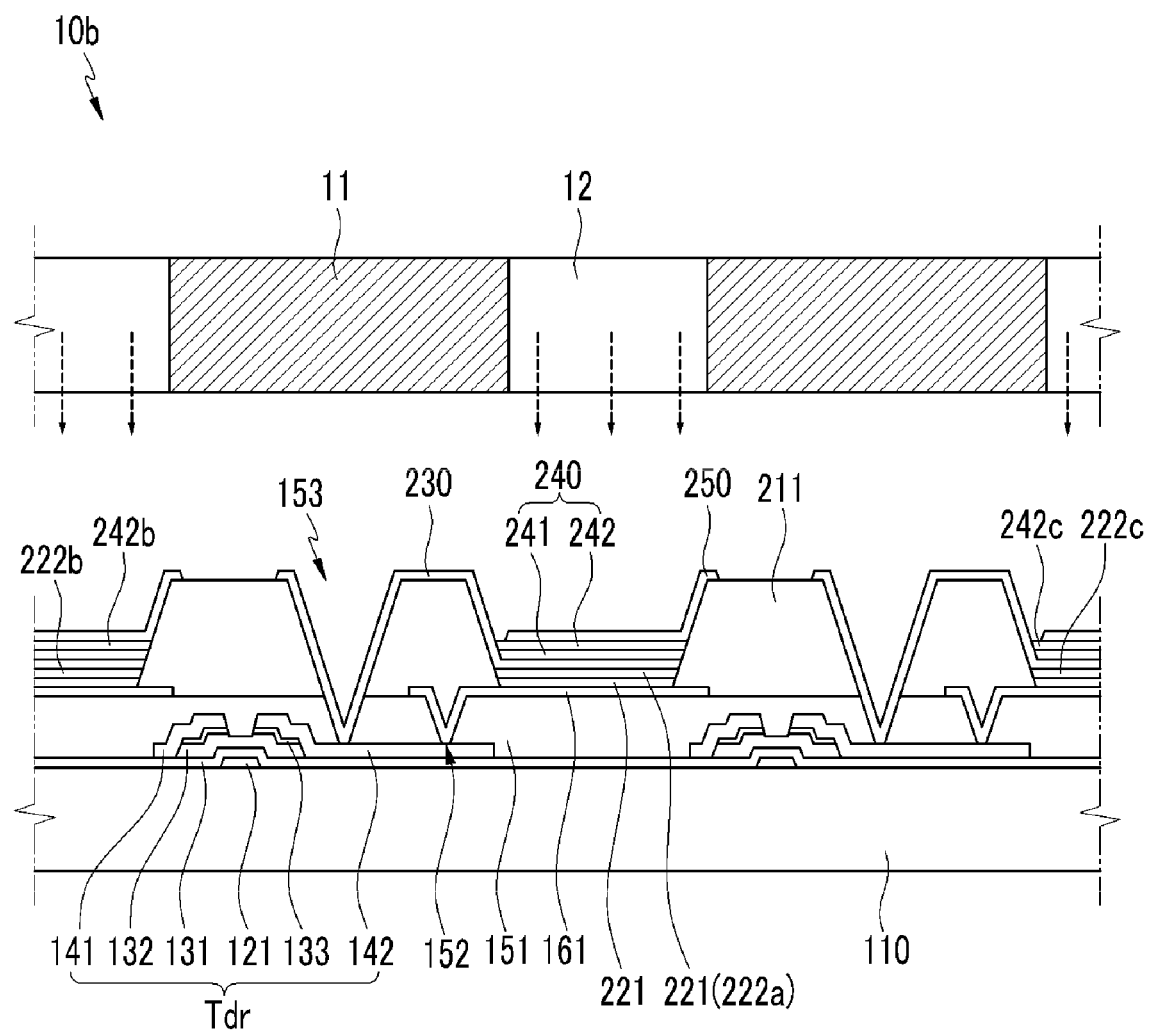
Figure 15B:
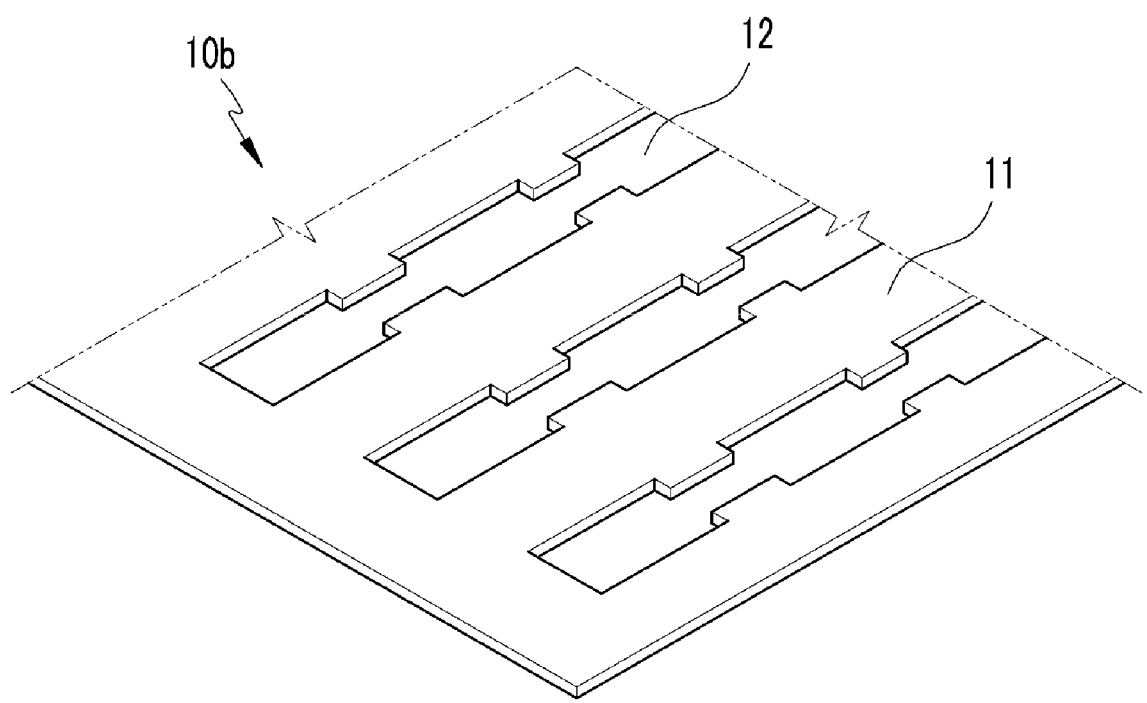

Referring to FIG. 15A, the cathode 250 are formed on the second organic layer 240 and the wall 211 using a shadow mask 10b shown in FIG. 15B, thereby completely forming the display device 1 shown in FIG. 2.

The shadow mask 10b used for the cathode 250 has a plurality of openings 12 extending lengthwise. The openings 12 correspond to the cathode 250.

The cathode 250 is formed by sputtering or the like. The cathode 250 is deposited corresponding to the openings 12 of the shadow mask 10b but not deposited corresponding to blocking parts 11. According to the aforementioned process, the cathode 250 is formed to have the overlapping area with the second anode 30, the second organic layer 240 disposed therebetween.

Figure 16:
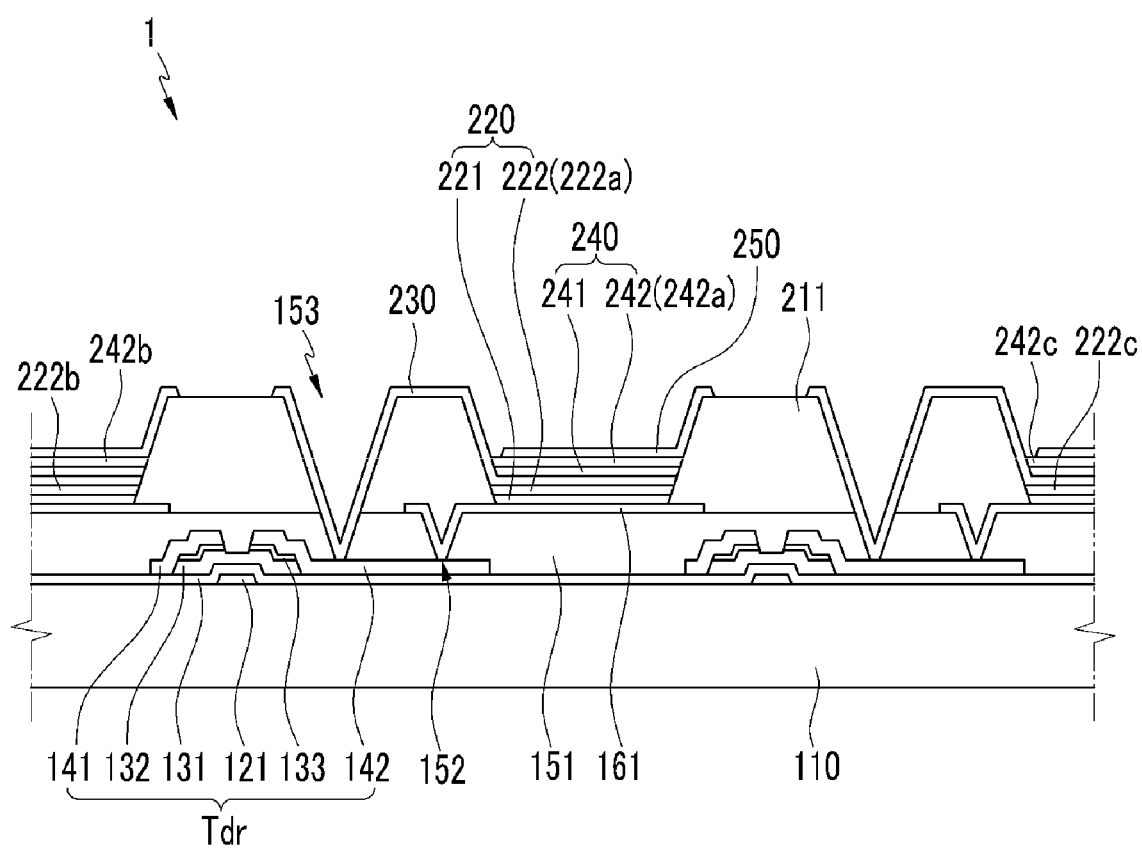
FIG. 16 is a sectional view of a display device according to a second exemplary embodiment of the present invention.

FIG. 16 is a sectional view of a display device according to a second exemplary embodiment of the present invention.

Unlike the first exemplary embodiment, a contact hole 154 is formed in a wall 211 to expose a first anode 161. A second anode 230 is connected to the first anode 161 through the contact hole 154. Thus, the second anode 230 receives the same electric signal, i.e. data signal, as the first anode 161 in the same manner of the first exemplary embodiment.

Figure 17:
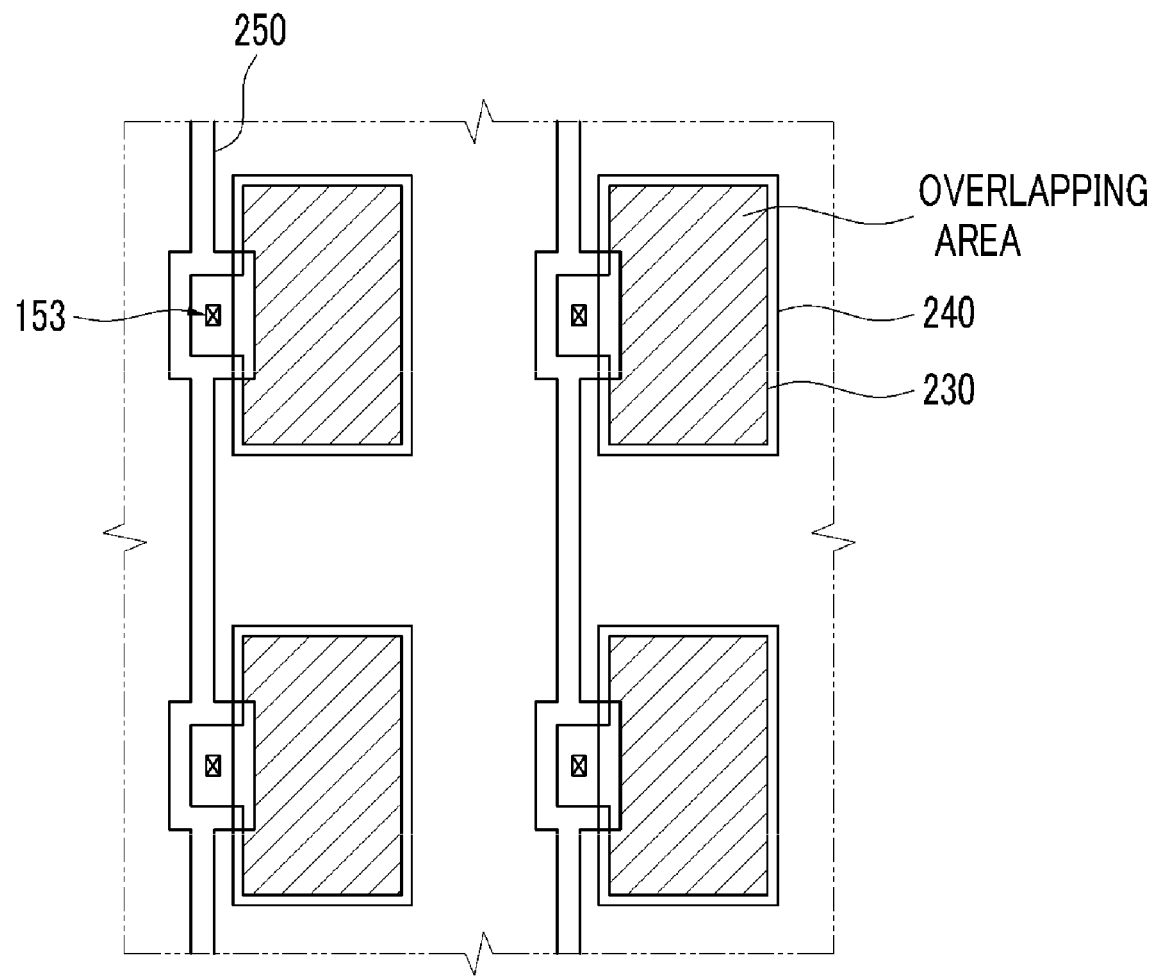
FIG. 17 is an arrangement view to illustrate the relation between a second anode and a cathode in a display device according to a third exemplary embodiment of the present invention.

FIG. 17 is an arrangement view to illustrate the relation between a second anode and a cathode in a display device according to a third exemplary embodiment of the present invention.

Unlike the first exemplary embodiment, a cathode 250 is formed across on a second organic layer 240 excluding around a contact hole 153.

Figure 18:
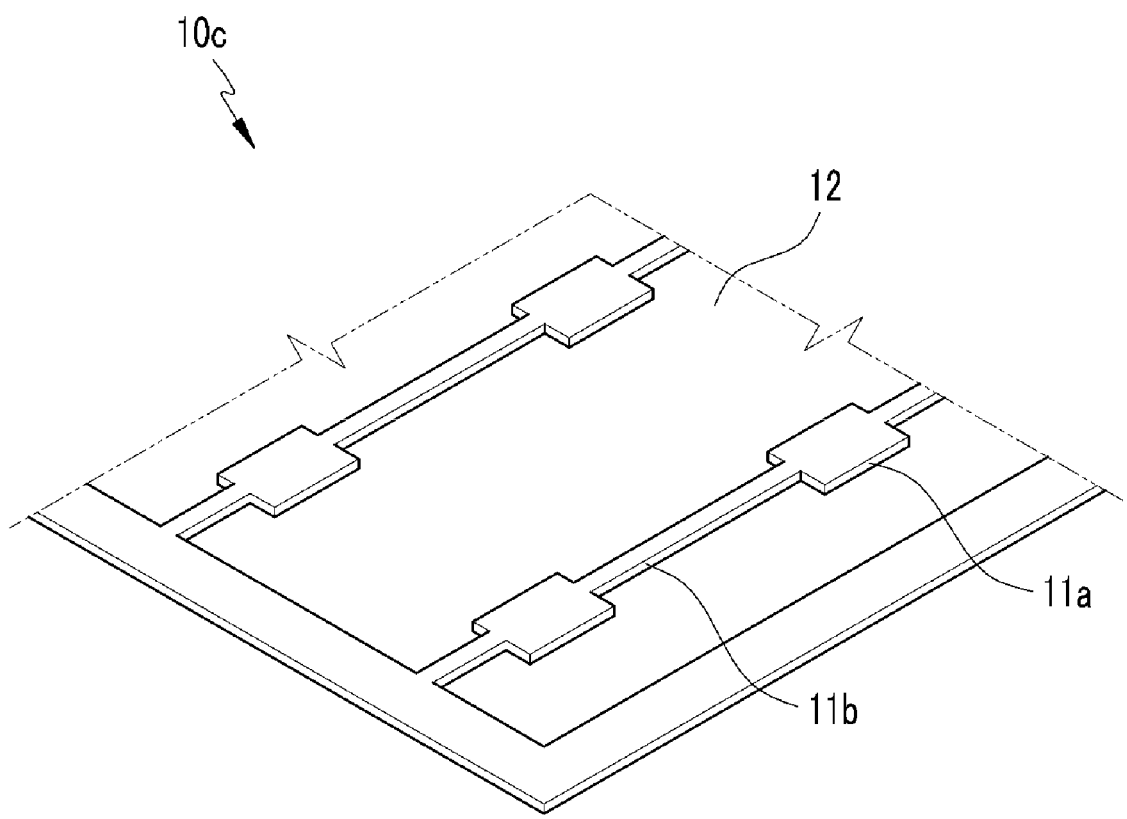
FIG. 18 is a perspective view of a shadow mask used for manufacturing a cathode in the display device according to the third exemplary embodiment of the present invention.

FIG. 18 is a perspective view of a shadow mask used for manufacturing the cathode in the display device according to the third exemplary embodiment of the present invention.

A shadow mask 10c has a first blocking part 11a provided so as not to form the cathode 250 on a portion of the second anode 230 around the contact hole 153; a second blocking part 11b to connect and to support the blocking parts 11a; and an opening 12 which is most parts of the shadow mask 10c.

It is not easy to apply a common voltage uniformly to the entire area of an insulating substrate 110 as the size of insulating substrate 110 increases. In the third exemplary embodiment, however, the cathode 250 is formed with a relatively wide area to decrease resistance, thereby applying the common voltage uniformly without difficulty.

Hereinafter, a display device 1 according to a fourth exemplary embodiment of the present invention will be described with reference to FIG. 19.

The following description focuses on different features of the display device in the fourth exemplary embodiment from in the first exemplary embodiment.

Likewise in the first exemplary embodiment, a first organic layer 220 formed on a first anode 161 is made of a polymer material and comprises a buffer layer 221 and a first light-emitting layer 222. The first light-emitting layer 222 comprises three sub-layers 222a, 222b and 222c each emitting different color of light.

A second anode 230 is formed on the first organic layer 220. The second anode 230 is arranged in the same manner of the first exemplary embodiment.

A second organic layer 240 is formed on the second anode 230. The second organic layer 240 is made of a low molecular material and comprises a hole-injecting layer 241, a hole transfer layer 24, a second light-emitting layer 243 and an electron transfer layer 244. The second light-emitting layer 243 comprises three sub-layers 243a, 243b and 243c each emitting different color of light.

The hole-injecting layer 241, the hole transfer layer 24 and the electron transfer layer 244 are formed on the entire surface of an insulating substrate 110. On the other hand, the second light-emitting layer 243 is formed only in the wall 211 and separated from its neighboring second light-emitting layer 243 in another pixel.

The hole-injecting layer 241 and the hole transfer layer 24 may be made of amine derivatives having intense fluorescence, for example, triphenyldiamine derivatives, styrylamine derivatives or amine derivatives having an aromatic fused ring.

The electron transfer layer 244 may be made of quinoline derivatives, especially aluminum tris 8-hydroxyquinoline Alq3, phenyl anthracene derivatives or tetraarylethene derivatives, for example.

A cathode 250 is formed on a second organic layer 240. The cathode 250 operates as a common electrode to apply the same common voltage to all pixels. The cathode 250 is formed on the entire surface of an insulating substrate 110 and may comprise a double layer made of Li/Al. The second organic layer 240 is disposed between the cathode 250 and the second anode 230, so that the cathode 250 does not directly contact the second anode 230. In detail, four layers of the second organic layer 240 are disposed between the cathode 250 and the second anode 230 in a wall 211, and three layers of the second organic layer 240 except the second light-emitting layer 243 are disposed between the cathode 250 and the second anode 230 on the wall 211.

A light-emitting principle in the display device according to the fourth exemplary embodiment is similar to one according to the first exemplary embodiment, and therefore detailed explanation thereof will be omitted.

The display device 1 according to the fourth exemplary embodiment comprises a couple of light-emitting layers, thereby having improved efficiency and brightness as compared with a conventional display device. Further, as the light-emitting layers 222 and 243 share the cathode 250, an additional insulating layer does not need to be disposed between the light-emitting layers 222 and 243. Accordingly, an insulating layer forming process can be omitted, and brightness decrease due to the insulating layer may not be generated.

Next, a manufacturing method of the display device according to the fourth exemplary embodiment of the present invention will be described with reference to FIGS. 20 through 22.

The display device is manufactured by the same processes in the first exemplary embodiment until the second anode 230 is formed.

Figure 20:
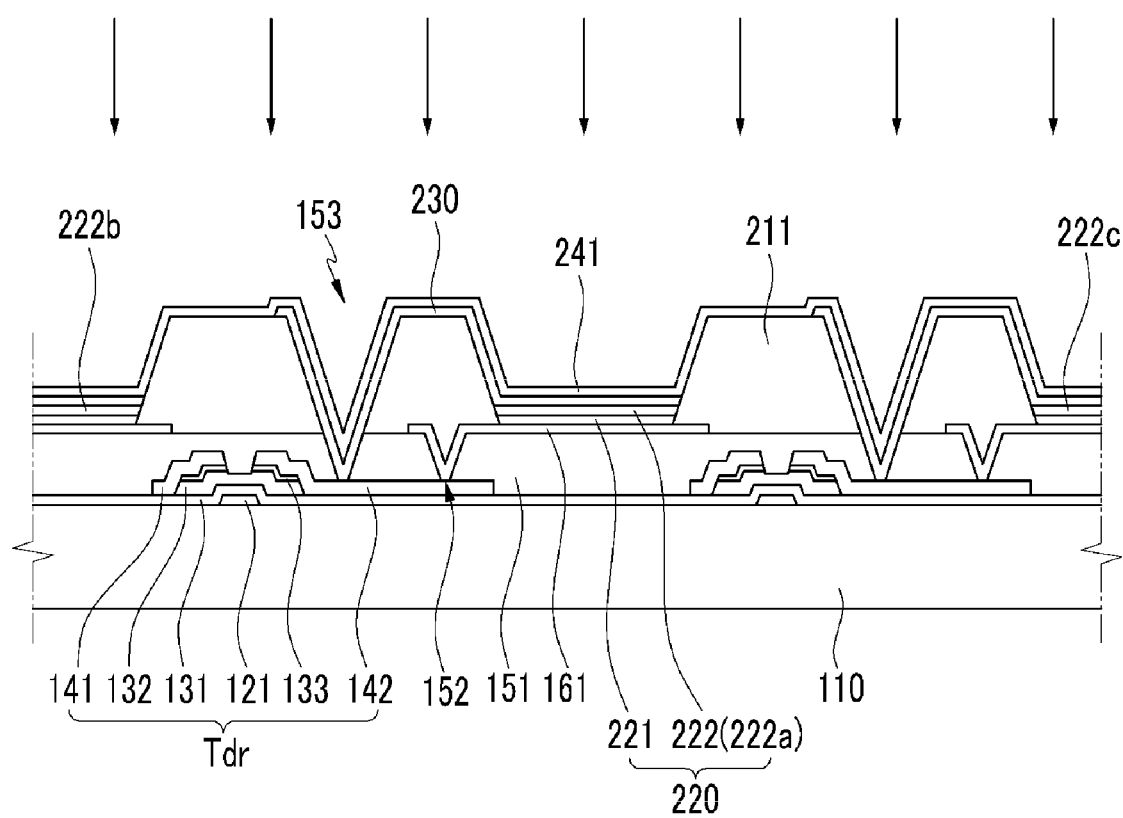
FIGS. 20 through 22 illustrate a manufacturing method of the display device according to the fourth exemplary embodiment of the present invention.

Then, referring to FIG. 20, the hole-injecting layer 241 is deposited on the second anode 230 and the wall 211 by a heat evaporation method. The hole-injecting layer 241 is formed without a shadow mask and a patterning process, thereby being formed on the entire surface of insulating substrate 110. The hole-injecting layer 241 is formed by providing vapor of a hole-injecting material from the lower part of insulating substrate 110 in the state that insulating substrate 110 is placed downside up. The vapor of the hole-injecting material gets lower in temperature by contacting the second anode 230 or the wall 211, thereby solidifying.

The hole transfer layer 24 is formed on the entire surface of insulating substrate 110 by the same method as the hole-injecting layer 241.

Figure 21A:
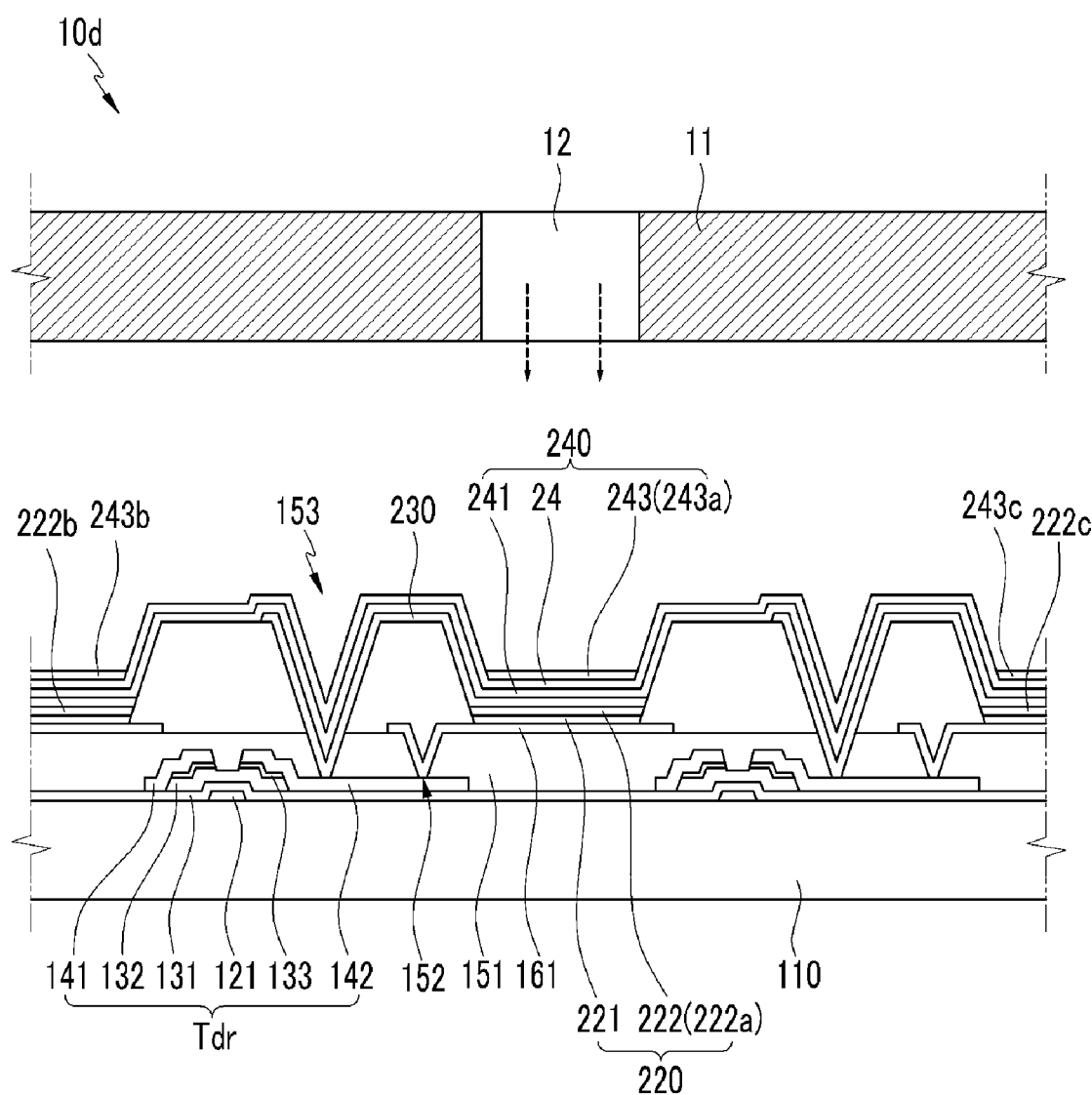
Figure 21B:
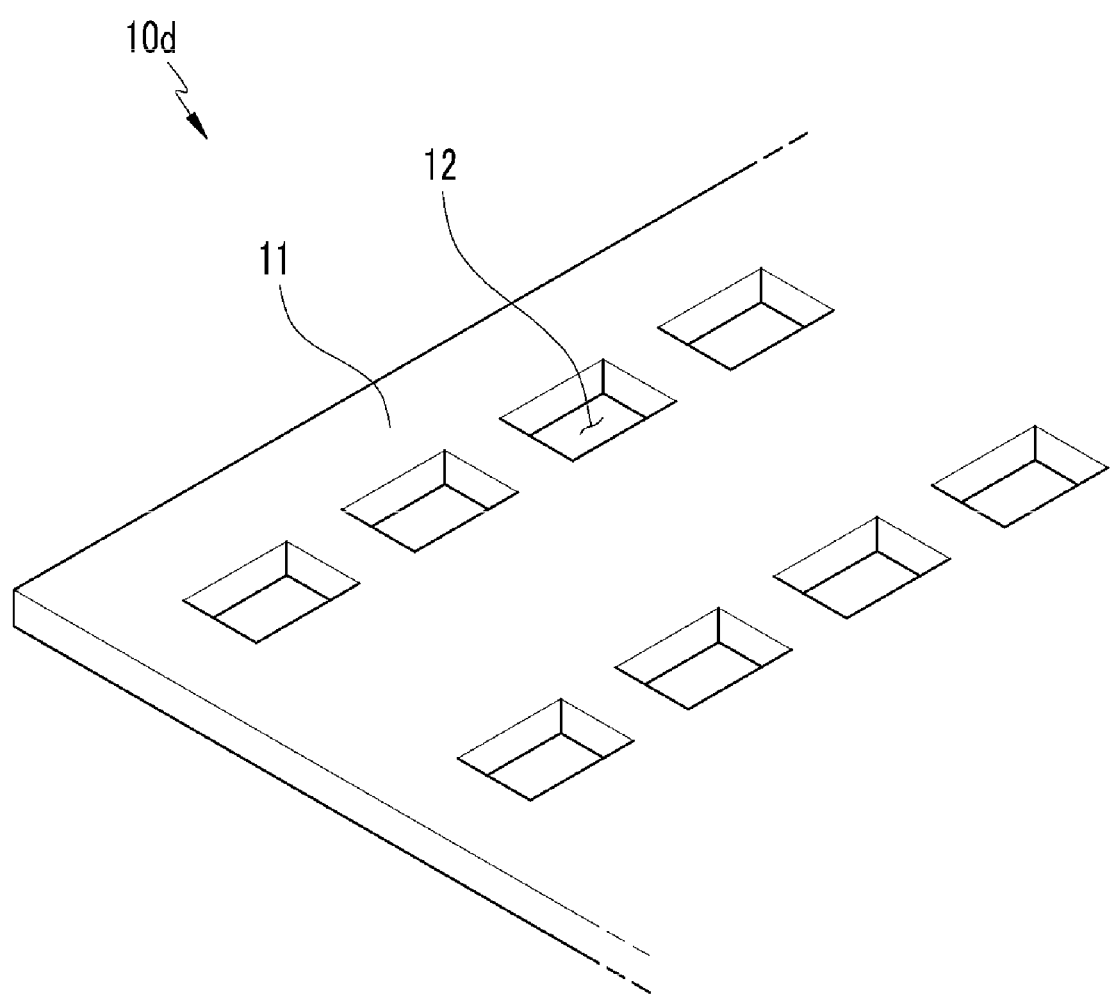

Referring to FIG. 21A, the second light-emitting layer 243 is formed using a shadow mask 10d. The second light-emitting layer 243 is formed by a heat evaporation method.

The shadow mask 10d used for forming the second light-emitting layer 243 has a plurality of openings 12 as shown in FIG. 2B. The size of the openings 12 corresponds to an area surrounded by the wall 211. The openings 12 are arranged in a plurality of lines at regular intervals. The interval between lines is slightly large as compared with the width of the openings 12.

Vapor of a light-emitting material is provided to the hole transfer layer 24 through the openings 12, but not to a portion of the wall 211 and the hole transfer layer 24 which correspond to blocking parts 11. The vapor of the light-emitting material gets lower in temperature by contacting the hole transfer layer 24, thereby solidifying.

Sub-layers 243a, 243b and 243c of the second light-emitting layer 243 are formed by the shadow mask 10d, while the disposition of the shadow mask 10d varies for each sub-layers 243a, 243b and 243c.

Figure 22:
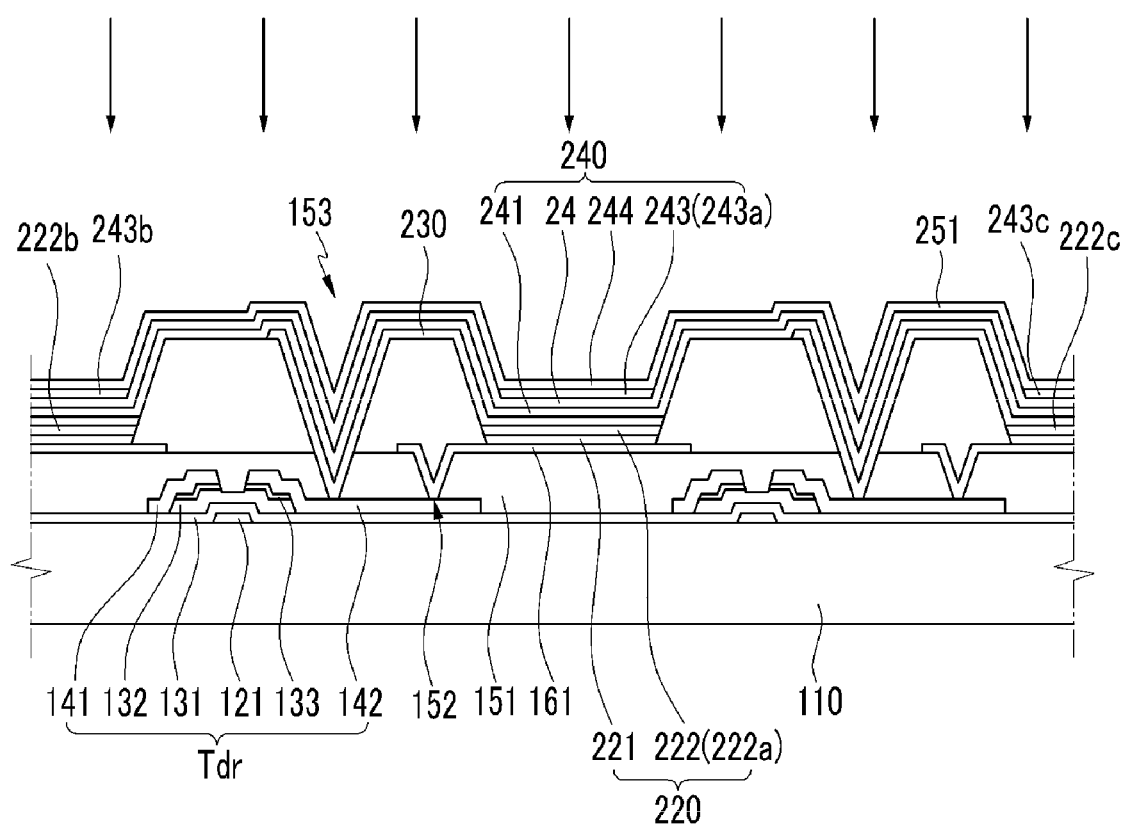

Referring to FIG. 22, the electron transfer layer 244 is deposited on the second light-emitting layer 243 by a heat evaporation method. The electron transfer layer 244 is formed without a shadow mask and a patterning process, thereby being formed on the entire surface of insulating substrate 110. Vapor of an electron transfer material gets lower in temperature by contacting the second light-emitting layer 243, the second anode 230 or the wall 211, thereby solidifying.

Figure 19:
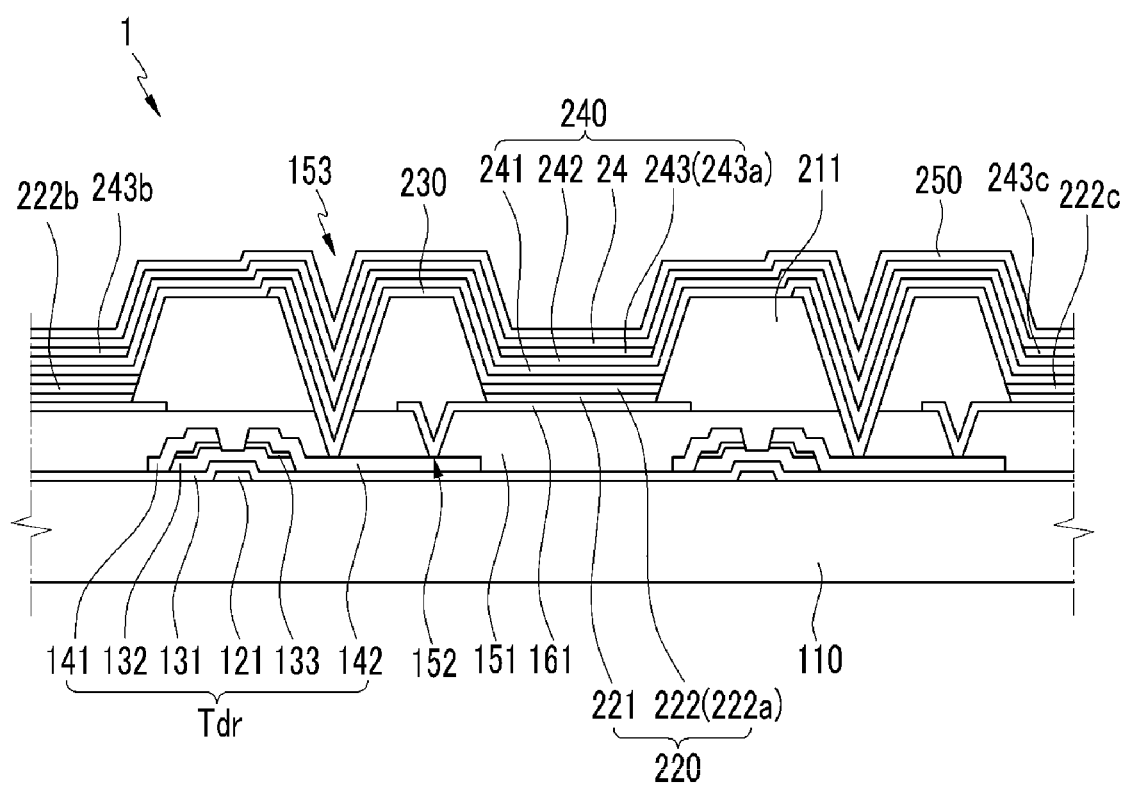
FIG. 19 is a sectional view of a display device according to a fourth exemplary embodiment of the present invention.

Then, the cathode 250 is formed on the electron transfer layer 244, thereby completing the display device 1 illustrated in FIG. 19. The cathode 250 may be formed on the entire surface of insulating substrate 110 by sputtering.

Figure 23:
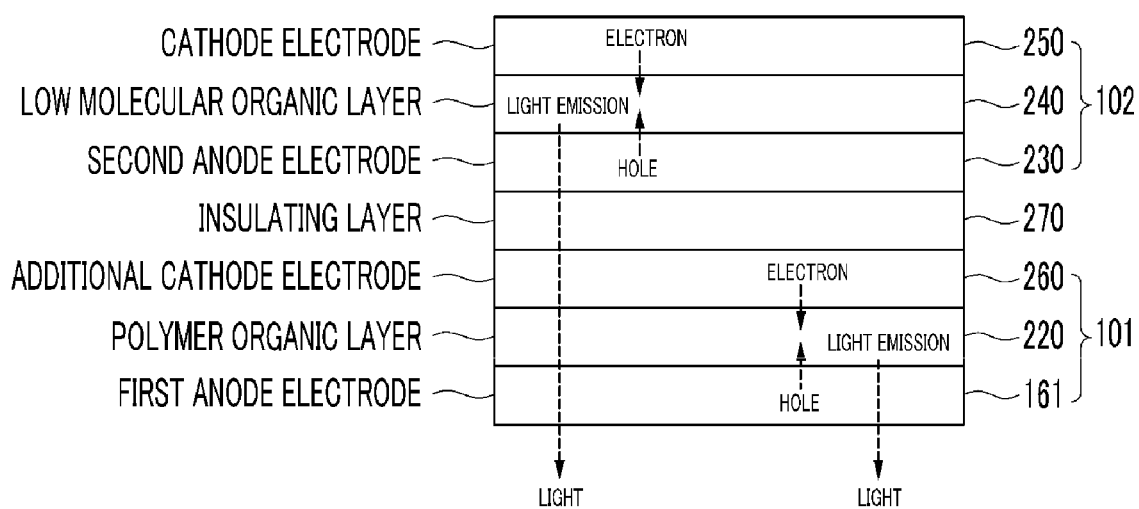
FIG. 23 is a configuration view of a display device according to a fifth exemplary embodiment of the present invention.

Hereinafter, a display device according to a fifth exemplary embodiment will be described with reference to FIG. 23.

In the display device according to the fifth exemplary embodiment, a first organic layer 220 is made of a polymer material, and a second organic layer 240 is made of a low molecular material.

An additional cathode 260 and an insulating layer 270 are formed between the organic layer 220 and a second anode 230 unlike the first exemplary embodiment. The cathode 250 is provided to be transparent including Mg and Ag and may be 10 nm and less in thickness.

In the fifth exemplary embodiment, a first anode 161, the first organic layer 220 and the additional cathode 260 are comprised in a first sub-display device 101, and the second anode 230, the second organic layer 240 and a cathode 230 are comprised in a second sub-display device 102. The first sub-display device 101 and the second sub-display device 102 may be driven independently by the insulating layer 270 disposed between the additional cathode 260 and the second anode 230.

In the first sub-display device 101, holes from the first anode 161 and electrons from the additional cathode 260 are combined each other in the first organic layer 220 to generate light. In the second sub-display device, holes from the second anode 230 and electrons from the cathode 250 are combined each other in the second organic layer 240 to generate light.

The first anode 161 and the second anode 230 are connected to the same thin film transistor, and the first sub-display device 101 and the second sub-display device 102 displays the same images. Accordingly, the sub-display devices 101 and 102 are driven together, thereby improving efficiency. Sub-display devices 101 and 102 may be alternately driven, thereby increasing a display device's life.

Although a few embodiments of the present invention have been shown and described, it will be appreciated by those skilled in the art that changes may be made in these embodiments without, however, departing from the spirit and scope of the invention.

What is claimed is:

1. A display device comprising:
   a thin film transistor formed on an insulating substrate;
   a first anode electrically connected to the thin film transistor;
   a first organic layer formed on the first anode and comprising a first light-emitting layer;
   a second anode formed on the first organic layer and electrically connected to the thin film transistor;
   a second organic layer formed on the second anode and comprising a second light-emitting layer; and
   a cathode formed on the second organic layer; and
   wherein the first anode and the second anode receive the same electric voltage, and the entire cathode is located outside of a space between the first anode and the second anode.

2. The display device according to claim 1, wherein the second anode directly contacts the first organic layer.

3. The display device according to claim 1, wherein the second organic layer is formed in an overlapping area of the second anode and the cathode, and the second anode does not directly contact the cathode.

4. The display device according to claim 3, wherein the first organic layer and the second organic layer comprise of a polymer.

5. The display device according to claim 4, further comprising a wall surrounding the first organic layer and the second organic layer, wherein the first organic layer and the second organic layer are formed by ink-jetting.

6. The display device according to claim 5, wherein the first organic layer further comprises a first buffer layer disposed between the first light-emitting layer and the first anode, and the second organic layer further comprises a second buffer layer disposed between the second anode and the second light-emitting layer.

7. The display device according to claim 6, wherein each of the first buffer layer and the second buffer layer includes poly-3,4-ethylenedioxythiophene PEDOT and poly styrene-sulfonate PSS.

8. The display device according to claim 5, wherein the second anode comprises a first part disposed on the first organic layer, and a second part formed on the wall and connecting the thin film transistor and the first part.

9. The display device according to claim 5, wherein the cathode comprises a first part disposed on the second organic layer, and a second part formed on the wall and connecting the neighboring first parts to each other.

10. The display device according to claim 4, wherein the cathode comprises one of a Ba/Al double layer, a Ba/Ag double layer, a Ca/Ag double layer, a LiF/Ca/Ag triple layer and a LiF/Ca/Al triple layer.

11. The display device according to claim 4, wherein the first light-emitting layer and the second light-emitting layer emit light at the same time.

12. The display device according to claim 1, wherein the first organic layer comprises polymer, and the second organic layer comprises a low molecular material.

13. The display device according to claim 12, wherein the first organic layer comprises a plurality of sub-layers, and at least one of the sub-layers is formed in an overlapping area of the second anode and the cathode.

14. The display device according to claim 12, an additional cathode is not disposed between the first anode and the second anode.

* * * * *